United States Patent [19]
Sato et al.

[11] Patent Number: 6,016,131
[45] Date of Patent: Jan. 18, 2000

[54] INDUCTIVELY COUPLED PLASMA REACTOR WITH AN INDUCTIVE COIL ANTENNA HAVING INDEPENDENT LOOPS

[75] Inventors: Arthur H. Sato, Santa Clara; Xue-Yu Qian, Milpitas, both of Calif.

[73] Assignee: Applied Materials, Inc., Santa Clara, Calif.

[21] Appl. No.: 09/305,091

[22] Filed: May 3, 1999

Related U.S. Application Data

[62] Division of application No. 08/515,695, Aug. 16, 1995, Pat. No. 5,907,221.

[51] Int. Cl.$^7$ .................................................. H01Q 1/36
[52] U.S. Cl. ...................... 343/895; 343/867; 315/111.51
[58] Field of Search .................... 343/895, 866, 343/867; 315/111.51, 111.21; 118/723 MP, 723 I

[56] References Cited

U.S. PATENT DOCUMENTS

| | | | |
|---|---|---|---|
| 3,569,777 | 3/1971 | Beaudry | 315/111 |
| 4,948,458 | 8/1990 | Ogle | 156/643 |
| 5,187,454 | 2/1993 | Collins et al. | 333/17.3 |
| 5,285,046 | 2/1994 | Hansz | 219/121.47 |
| 5,346,578 | 9/1994 | Benzing et al. | 156/345 |
| 5,349,313 | 9/1994 | Collins et al. | 333/131 |
| 5,392,018 | 2/1995 | Collins et al. | 336/155 |
| 5,464,476 | 11/1995 | Gibb et al. | 118/723 MP |
| 5,540,824 | 7/1996 | Yin et al. | 204/298.34 |
| 5,554,223 | 9/1996 | Imahashi | 118/723 I |
| 5,558,722 | 9/1996 | Okumura et al. | 118/723 I |
| 5,653,811 | 8/1997 | Chan | 118/723 I |

FOREIGN PATENT DOCUMENTS 0 459 177 A2   4/1991   European Pat. Off. .

OTHER PUBLICATIONS

Stewart, R.A., Vitello, P., Graves, D.B., Jaeger, E.F., Berry, L.A., "Plasma uniformity in high–density inductively coupled plasma tools," *Plasma Sources Science Technology*, No. 4, 1995, pp. 36–46, Great Britain.

*Primary Examiner*—Hoanganh Le
*Assistant Examiner*—Hoang Nguyen
*Attorney, Agent, or Firm*—Michaelson and Wallace

[57] ABSTRACT

An inductively coupled plasma reactor for processing a substrate has an inductively coupled coil antenna including plural inductive antenna loops which are electrically separated from one another and independently connected to separately controllable plasma source RF power supplies. The RF power level in each independent antenna loop is separately programmed and instantly changeable to provide a perfectly uniform plasma ion density distribution across the entire substrate surface under a large range of plasma processing conditions, such as different process gases or gas mixtures. In a preferred embodiment, there are as many separately controllable RF power supplies as there are independent antenna loops, and all the separately controllable power supplies receive their RF power from a commonly shared RF generator.

63 Claims, 3 Drawing Sheets

INDUCTIVELY COUPLED PLASMA REACTOR WITH AN INDUCTIVE COIL ANTENNA HAVING INDEPENDENT LOOPS

CROSS REFERENCE TO RELATED APPLICATIONS

This is a divisional of U.S. application Ser. No. 08/515,696, filed Aug. 16, 1995, now U.S. Pat. No. 5,907,221.

BACKGROUND OF THE INVENTION

1. Technical Field

The invention is related to radio frequency (RF) plasma reactors for processing semiconductor wafers, flat panel display wafer or substrates generally, and in particular to inductively coupled RF plasma reactors and improvements increasing the uniformity of the plasma ion density across the entire surface of large substrates.

2. Background Art

RF plasma reactors are employed in performing various processes on semiconductor wafers, including etching processes and chemical vapor deposition processes, for example. An inductively coupled RF plasma reactor typically has an inductive coil antenna wound around the reactor chamber and connected to a plasma source RF power supply.

Such an inductively coupled plasma reactor is particularly useful because it can achieve a very high plasma ion density for high production throughput, while avoiding a concomitant increase in ion bombardment damage of the wafer.

One problem with inductively coupled plasma reactors is that the plasma ion density distribution can vary greatly, depending upon various parameters including the particular process gas or gas mixture introduced into the reactor chamber. For example, the plasma ion density may be high at the wafer center and low at the wafer periphery for one process gas, while for another process gas it may be the opposite pattern (i.e., low at the wafer center and high at the wafer periphery). As a result, the antenna design must be customized for each different process or process gas to provide an acceptable degree of plasma ion density uniformity across the wafer surface, a significant problem.

If the plasma reactor is employed in processing a large flat panel display wafer (comprising a glass substrate), for example, the large surface area of the substrate prevents achievement of good plasma ion density uniformity across the substrate surface without extraordinary care in customizing the antenna design.

It is therefore an object of the present invention to provide a uniform plasma ion density across an entire substrate surface in an inductively coupled plasma reactor without requiring installation of a completely new antenna in the plasma reactor.

SUMMARY OF THE DISCLOSURE

An inductively coupled plasma reactor for processing a substrate has an inductively coupled coil antenna including plural inductive antenna loops which are electrically separated from one another and can be connected to independent RF power supplies. The RF power level in each independent antenna loop is separately programmed and instantly changeable to provide a perfectly uniform plasma ion density distribution across the entire substrate surface under a large range of plasma processing conditions, such as different process gases or gas mixtures and/or absorbed RF power levels. In a preferred embodiment, there are as many independent RF power regulating circuit elements as there are independent antenna loops, and all the independent RF power regulating circuit elements receive RF power from a commonly shared RF generator. In this preferred embodiment, a variable reactance element is connected in series with each independent antenna loop, so that all antenna loops are separately and instantaneously controlled. Typically, the independent antenna loops are over the ceiling of the reactor chamber, while a wafer pedestal near the chamber floor supports the substrate being processed. In an alternative embodiment, a separate RF generator is provided for each independent antenna loop.

In accordance with another aspect of the invention, the plasma reactor is a capacitively coupled reactor, having a pair of electrodes, including a cathode near the floor of the reactor chamber underlying the substrate being processed, and an anode at the top or over the ceiling of the reactor chamber, the anode consisting of plural independent electrode segments connected to separately controllable RF power sources.

DETAILED DESCRIPTION OF THE PREFERRED EMBODIMENTS

Figure 1:
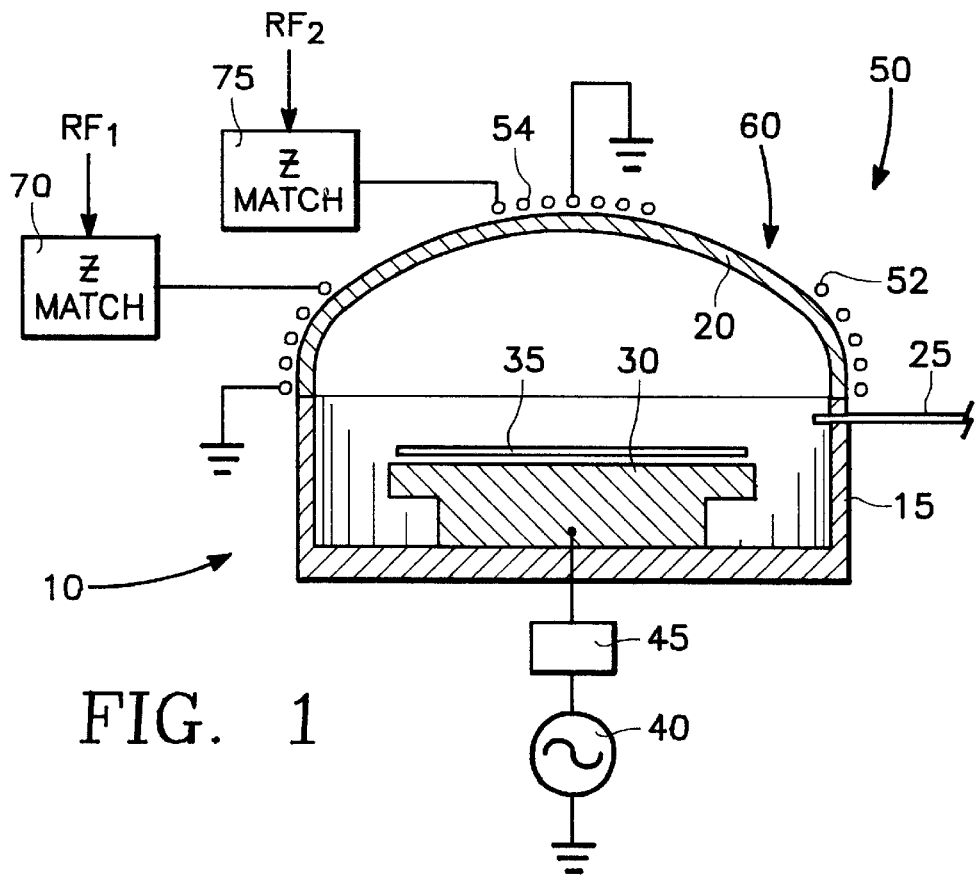
FIG. 1 is an elevational view of an inductively coupled plasma reactor in accordance with a first embodiment of the invention.
Figure 2:
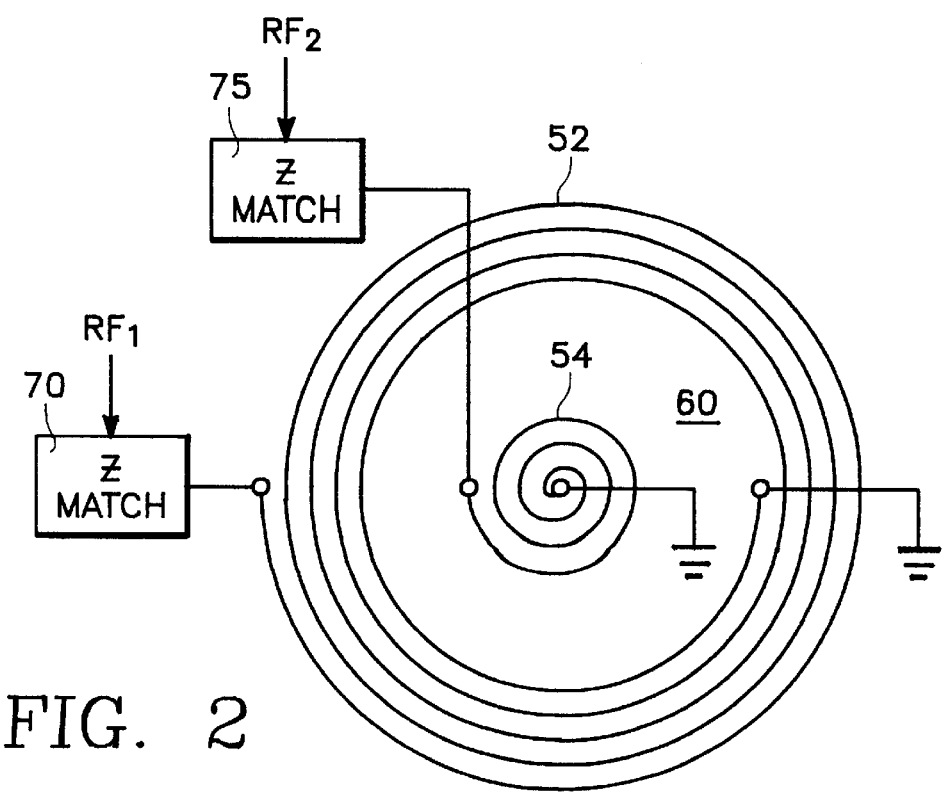
FIG. 2 is a top view corresponding to FIG. 1.

Referring to the embodiment of FIGS. 1 and 2, an inductively coupled RF plasma reactor has a vacuum chamber 10 having a generally cylindrical side wall 15 and a dome shaped ceiling 20. A gas inlet tube 25 supplies process gas (e.g., chlorine for etch processing) into the chamber 10. A wafer pedestal 30 supports a substrate such as semiconductor wafer 35 near the floor of the chamber 10. A bias RF power supply 40 connected to the pedestal 30 through a conventional RF impedance match network 45 controls the plasma ion density at the top surface of the wafer 35. A plasma is ignited and maintained within the chamber 10 by RF power inductively coupled from a coil antenna 50 consisting of a pair of independent (electrically separate) antenna loops 52, 54 wound around different portions of the dome-shaped ceiling. In the embodiment of FIG. 1, both loops are wound around a common axis of symmetry coincident with the axis of symmetry of the dome-shaped ceiling 20 and the axis of symmetry of the wafer pedestal 30 and wafer 35. The antenna loop 52 is of the conventional type typically employed in an inductively coupled reactor and is wound around the bottom portion of the dome-shaped ceiling 20, leaving an aperture 60 surrounded by the antenna loop 52. The other antenna loop 54 is placed over the ceiling 20 in the center of the aperture 60. Separately controlled RF signals RF1 and RF2 are applied through RF impedance match networks 70, 75 to respective ones of the independent antenna loops 52, 54, so that RF power in each loop 52, 54 is separately controlled. The RF power signal RF1 applied to the outer antenna loop 52 predominantly affects plasma ion density near the periphery of the wafer 35 while the RF power signal RF2 applied to the inner antenna loop 54 predominantly affects plasma ion density near the center of the wafer 35. Thus, for example, where it is found in an etch process performed with the reactor of FIG. 1 that the etch rate at the wafer center is less than the etch rate at the wafer periphery, the power of the RF signal RF2 on the inner antenna loop 54 is increased until the center and periphery etch rates are at least nearly equal. Likewise, if the center etch rate is found to be higher than the periphery etch rate, then the RF signal RF2 on the inner antenna loop 54 is decreased (or the RF signal on the outer antenna loop 52 is increased) until uniformity of plasma ion distribution is at least nearly achieved.

Thus, the same RF plasma reactor can be employed over a large range of different process parameters (including a large choice of process gases) tending to have different plasma ion density distribution patterns that must be compensated differently. The same plasma reactor is capable of compensating for the different plasma ion density distribution patterns characteristic of different plasma processes.

Figure 3:
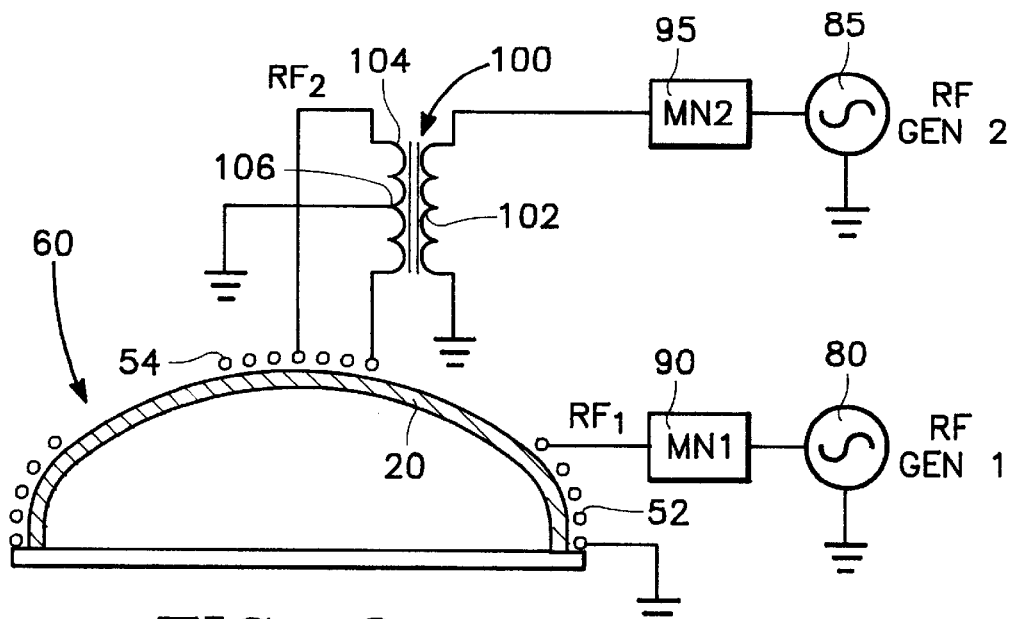
FIG. 3 is a schematic diagram illustrating a first RF power distribution circuit for the embodiment of FIG. 1.

Referring to FIG. 3, each antenna loop 52, 54 may be provided with its own RF power generator 80, 85 and RF impedance match network 90, 95 connected in series between the respective RF power generator 80, 85 and antenna loop 52, 54. In accordance with one aspect of the invention, the RF impedance match network (e.g., the RF impedance match network 95) may be coupled to the antenna loop (e.g., the inner antenna loop 54) through a transformer, such as the transformer 100 shown in FIG. 3. In the embodiment of FIG. 3, the transformer 100 has a primary winding 102 connected to the output of the impedance match network 95 and a secondary winding 104 connected across the inner antenna loop 54. To provide a potential reference for the inner antenna loop 54, a ground tap 106 is connected to the center of the secondary winding 104. The advantage of this method of powering the antenna loop 54 is that it minimizes capacitive coupling to the plasma by reducing the peak voltage (with respect to ground) on the antenna loop 54. A general advantage of the embodiment of FIG. 3 is that the RF frequencies at each of the independent antenna loops 52, 54 are separately controllable so that the same RF frequency may be applied to both loops 52, 54 or else different RF frequencies may be applied to the loops 52, 54.

Figure 4:
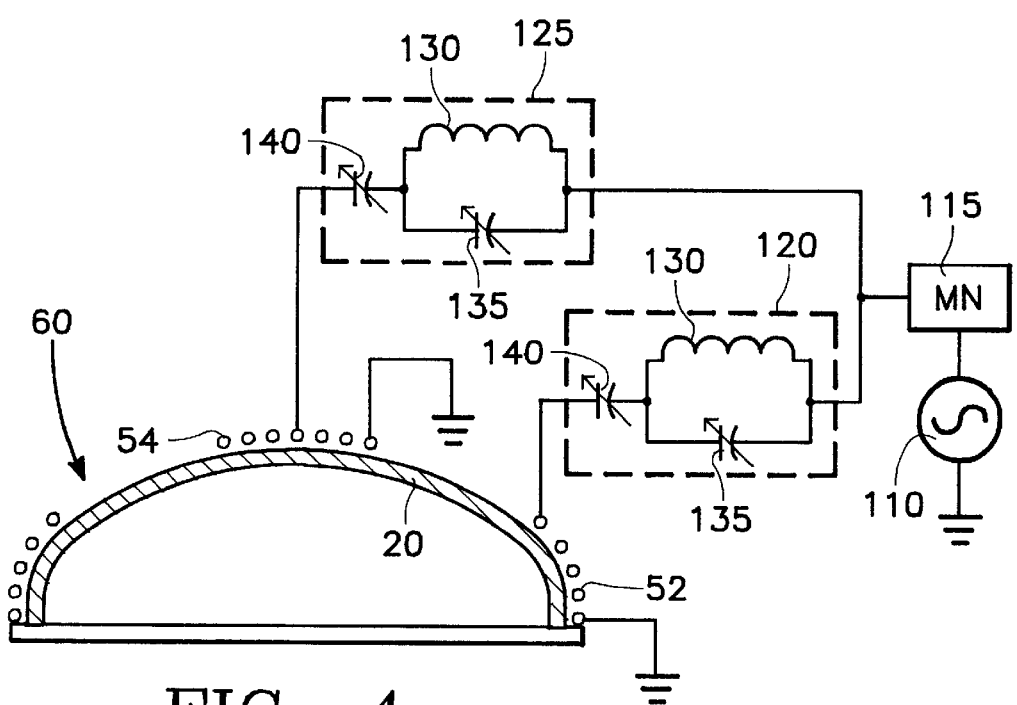
FIG. 4 is a schematic diagram illustrated a second RF power distribution circuit having a single commonly shared RF power generator for the inductive coil antenna of the embodiment of FIG. 1.

Preferably, a common RF generator powers both antenna loops 52, 54, the RF power in each loop 52, 54 being separately controlled, as in the embodiment of FIG. 4. This feature has the advantage of simplicity and cost effectiveness. In FIG. 4, the single RF generator 110 is coupled through an RF impedance match network 115 to a pair of variable reactive circuits 120, 125 which in turn coupled RF power to the respective outer and inner antenna loops 52, 54. Each one of the variable reactive circuits 120, 125 consists of an inductor 130 and variable capacitor 135 connected in parallel, a second variable capacitor 140 being connected in series with the combination of the parallel inductor and capacitor 130, 135. The variable capacitors in each variable reactive circuit 120, 125 permit the RF power level to be separately adjusted in each of the independent antenna loops 52, 54.

There may be more than two independent antenna loops. Moreover, the plural independent antenna loops may be either symmetrically wound relative to a common axis of symmetry, as in the embodiment of FIGS. 1–4, or may be wound around separate axes and thus centered at different points distributed across the ceiling, as in the embodiment of FIGS. 5 and 6.

Figure 5:
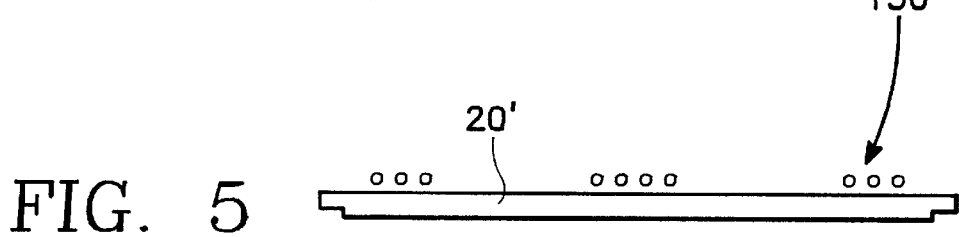
FIG. 5 is an elevational view of a portion of an inductively coupled plasma reactor in accordance with a second embodiment of the invention.
Figure 6:
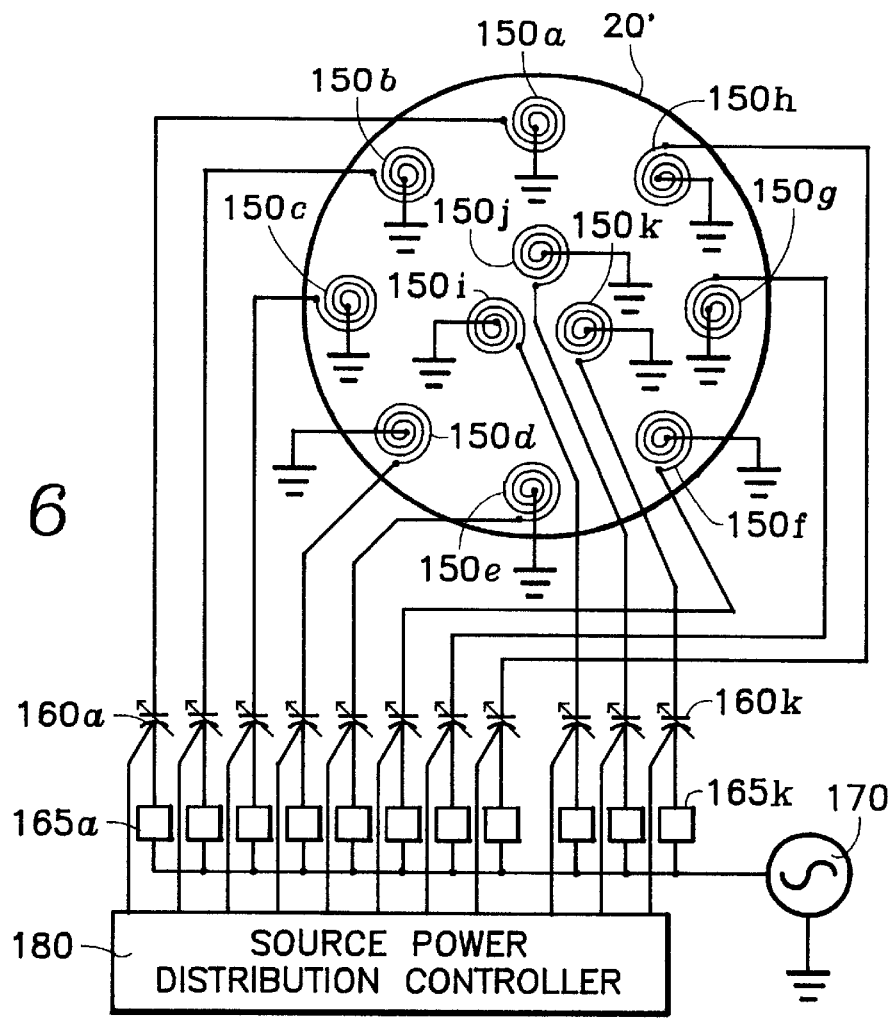
FIG. 6 is a top view corresponding to FIG. 5. and further illustrating in schematic form an RF power distribution circuit having a single commonly shared RF power generator.

Referring to FIGS. 5 and 6, the reactor may have a flat ceiling 20'. In this example, there are eight outer antenna loops 150a–150h centered at uniform intervals along an outer radius and three inner antenna loops 150i–150k. Each loop 150 has a diameter which only a small fraction (e.g., 1/10) of the diameter of the wafer 35. The inner end of each antenna loop 150 is grounded while the outer end is connected through a respective one of a bank of variable capacitors 160a–160k and through respective reactive networks 165a–165k to a single commonly shared RF generator 170. The reactive networks may, for example, be RF impedance match networks. Control over each individual variable capacitor 160 in the bank of variable capacitors 160a–160k is exercised by a source power distribution controller 180. The user governs the RF power levels in each one of the independent antenna loops 150a–150k through the controller 180. A greater of lesser number of antenna loops may be employed than illustrated here. The reactor ceiling 20' is flat in this example, but it may also be domed, cylindrical or some other shape. Preferably, the independent loops are arranged symmetrically with respect to the reactor ceiling and substrate pedestal or processing substation.

Figure 7:
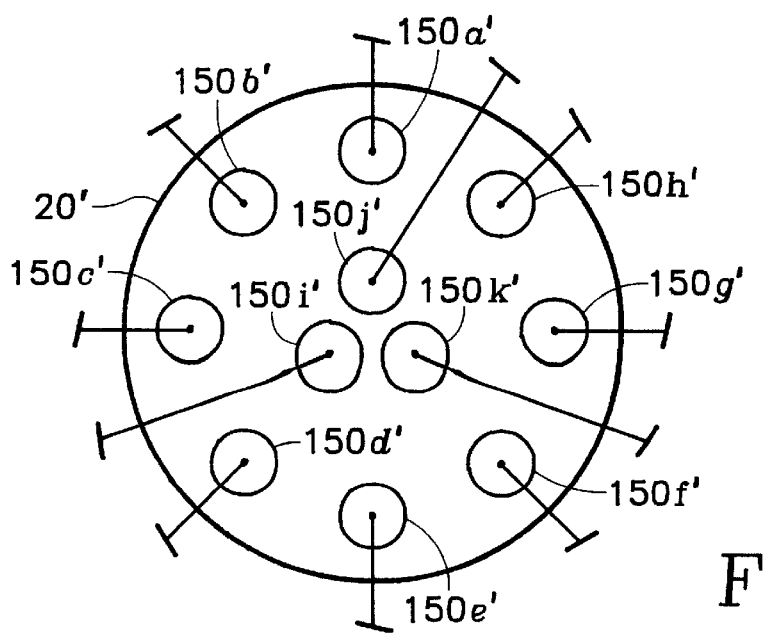
FIG. 7 is a top view of a capacitively coupled RF plasma reactor in accordance with an alternative embodiment of the invention.

Referring to the alternative embodiment of FIG. 7, each of the independent loops 150a–150k may be replaced by small disk-shaped independent electrodes 150'a–150'k of the approximately the same diameter as the independent loop which it replaces. In FIG. 7, the RF plasma reactor is a capacitively coupled reactor. For this purpose, the wafer pedestal may be either grounded or connected to the separate RF power generated 40 as illustrated in FIG. 1. The independent electrodes together function as an anode electrode array while the wafer pedestal functions as the cathode of the capacitively coupled RF plasma reactor.

While the invention has been described in detail by specific reference to preferred embodiments, it is understood that variations and modifications thereof may be made without departing from the true spirit and scope of the invention.

What is claimed is:

1. An inductively coupled plasma reactor for processing a substrate in a reactor chamber containing a process gas, comprising:

an inductively coupled coil antenna, said coil antenna comprising plural inductive antenna loops adjacent different portions of said chamber and which are electrically separate from one another;

plural RF impedance match networks each connected to respective ones of the antenna loops;

plural RF power level adjusting circuits each connected to a respective one of the RF match networks and being capable of changing and setting an RF power level;

an RF power distribution controller connected to each of the RF power level adjusting circuits, said controller being capable of simultaneously controlling each of the RF power level adjusting circuits to individually govern the RF power levels to provide a uniform plasma ion density distribution across the top surface of the substrate.

2. The reactor of claim 1 further comprising RF power circuitry connected to said plural inductive antenna loops that generates an RF power signal from a common RF power generator.

3. The reactor of claim 1 further comprising plural RF power generators, each of said RF power generators generating a respective RF power signal.

4. The reactor of claim 3, wherein at least two of said respective RF power signals are a different frequency.

5. The reactor of claim 1 wherein said RF power level adjusting circuits comprises plural variable reactance elements connected in series with respective ones of said independent antenna loops.

6. The reactor of claim 1 wherein said reactor comprises:
a ceiling, wherein said plural independent antenna loops are disposed over said ceiling; and
a wafer pedestal.

7. The reactor of claim 6 wherein said plural independent antenna loops comprise respective conductors wound around respective loop axes, all of said respective loop axes being coincident with an axis of symmetry of said wafer pedestal.

8. The reactor of claim 7 wherein said reactor ceiling is dome-shaped and wherein said axis of symmetry is coincident with an axis of symmetry of said dome-shaped ceiling.

9. The reactor of claim 8 wherein said antenna loops are centered at intervals along plural radii of said dome-shaped ceiling, said plural radii being centered relative to said wafer pedestal.

10. The reactor of claim 9 wherein said intervals are uniform.

11. The reactor of claim 6 wherein said plural independent antenna loops comprise respective conductors wound around respective loop axes, said respective loop axes being distributed among different points over said ceiling, said loops having diameters less than that of said wafer.

12. The reactor of claim 11 wherein said diameters are a relatively small fraction of the diameter of said wafer whereby each loop primarily affects a plasma ion density at a small local region over said wafer.

13. A plasma reactor for processing a substrate in a reactor chamber containing a process gas, comprising:
a coil antenna including plural antenna loops adjacent respective different portions of said chamber, said loops being in parallel with each other electrically, and adapted to establish a plasma within said chamber primarily by inductive coupling;
plural RF impedance match networks each connected to respective ones of the antenna loops;
a plurality of RF power level adjustors connected to respective ones of the RF impedance match network, said RF power level adjustors connected in series with said antenna loops, each of said RF power level adjustors also adapted to be connected to a source of RF power and being independently controllable with respect to the remaining RF power level adjustors to provide a desired plasma characteristic;
an RF power distribution controller wherein each of said RF power level adjustors responds to an adjustment signal from said controller to adjust the power to each antenna loop to achieve a predetermined desired plasma characteristic.

14. A plasma reactor as in claim 13 in which each antenna loop is provided with a respective one of said power level adjustors.

15. A plasma reactor as in claim 13 in which a single source of RF power supplies each of said power level adjustors.

16. A plasma reactor as in claim 13 in which each of said loops has a central axis of symmetry.

17. A plasma reactor as in claim 16 in which each said axis of symmetry is spaced from every other such axis.

18. A plasma reactor as in claim 16 in which at least two of said axes of symmetry coincide with each other.

19. A plasma reactor as in claim 13 in which each of said adjustors includes an adjustable reactance.

20. A method for processing a substrate in a reactor chamber containing a process gas, comprising:
coupling RF power into said chamber using an RF radiator comprising plural conductive elements which are electrically separated from one another and distributed at respective locations adjacent said chamber, each of said plural conductive elements connected to a respective one of a plural RF impedance match network, said coupling of RF power by employing plural RF power level adjusting circuits, each of the adjusting circuits being connected to a respective one of the RF impedance match networks and connected to receive respective RF power signals, respective RF power signals being provided by an RF power generator, each of the RF power level adjusting circuits further being capable of changing and setting an RF power level of the RF power signal; and
simultaneously controlling each of the RF power level adjusting circuits to individually govern the RF power level of each of the RF power signals so as to control the plasma ion density distribution across the top surface of the substrate by employing an RF power distribution controller connected to each of the RF power level adjusting circuits.

21. The method of claim 20, wherein respective RF power signals are generated by plural RF power generators.

22. The method of claim 21, wherein at least two of said plural RF power generators generate different frequencies.

23. A plasma reactor for processing a substrate, comprising:
an RF radiator capable of coupling power into a processing chamber, said radiator comprising plural conductive elements adjacent different portions of the chamber which are electrically separate from one another;
plural RF impedance match networks each connected to respective ones of the plural conductive elements;
plural RF power level adjusting circuits each connected to a respective one of the RF impedance match networks and connected to receive respective RF power signals, each of the RF power level adjusting circuits being capable of changing and setting an RF power level of the RF power signal;
an RF power distribution controller connected to each of the RF power level adjusting circuits, said controller being capable of simultaneously controlling each of the RF power level adjusting circuits to individually govern the RF power level of each of the RF power signals to provide a uniform plasma ion density distribution across the top surface of the substrate.

24. The reactor of claim 23 further comprising:
plural RF power generators providing said respective RF power signals, wherein at least two of said respective RF power signals are different frequencies.

25. An inductively coupled plasma reactor for processing a substrate, comprising:
a wafer pedestal;
an inductively coupled coil antenna, said coil antenna comprising plural inductive antenna loops adjacent different portions of said chamber and which are electrically separate from one another;

said plural inductive antenna loops comprising respective conductors wound around respective loop axes, all of said respective loop axes being coincident with an axis of symmetry of said wafer pedestal;

plural RF impedance match networks each connected to respective ones of the antenna loops;

plural RF power level adjusting circuits each connected to a respective one of the RF impedance match networks and connected to receive respective RF power signals, each of the RF power level adjusting circuits being capable of changing and setting an RF power level of the RF power signal; and an RF power distribution controller connected to each of the RF power level adjusting circuits, said controller being capable of simultaneously controlling each of the RF power level adjusting circuits to individually govern the RF power level of each of the RF power signals to provide a uniform plasma ion density distribution across the top surface of the substrate.

26. The reactor of claim 25 further comprising RF power circuitry connected to said plural RF power level adjusting circuits, said RF power circuitry generating said respective RF power signals from a common RF generator.

27. The reactor of claim 26 wherein said RF power level adjusting circuits comprise plural variable reactance elements connected in series with respective ones of said independent antenna loops.

28. The reactor of claim 25 further comprising plural RF power generators generating said respective RF power signals.

29. The reactor of claim 28 wherein at least two of said respective RF power signals are of different frequencies.

30. The reactor of claim 25 wherein said reactor further comprises a ceiling, wherein said plural independent antenna loops are disposed over said ceiling.

31. The reactor of claim 30 wherein said reactor ceiling is dome-shaped and wherein said axis of symmetry is coincident with an axis of symmetry of said dome-shaped ceiling.

32. The reactor of claim 25 further comprising RF power circuitry connected to said plural RF power level adjusting circuits, said RF power circuitry generating said respective RF power signal from a common RF generator.

33. The reactor of claim 32 wherein said RF power level adjusting circuits comprise plural variable reactance elements connected in series with respective ones of said independent antenna loops.

34. The reactor of claim 25 further comprising plural RF power generators generating said respective RF power signals.

35. The reactor of claim 34 wherein at least two of said respective RF power signals are of different frequencies.

36. The reactor of claim 25 wherein said reactor further comprises a ceiling, wherein said plural independent antenna loops are disposed over said ceiling.

37. The reactor of claim 36 wherein said ceiling is dome-shaped and wherein said axis of symmetry is coincident with an axis of symmetry of said dome-shaped ceiling.

38. A plasma reactor for processing a workpiece, comprising:

a processing chamber;

a workpiece support disposed within said processing chamber;

a dome-shaped ceiling overlying said workpiece support;

an RF radiator comprising plural conductive elements that are electrically separate from each other, said plural conductive elements adjacent different portions of said processing chamber;

an RF power distribution controller connected to respective ones of said plural conductive elements, said RF power distribution controller capable of simultaneously controlling an RF power level to each one of said plural conductive elements so as to provide a uniform plasma ion density distribution across the workpiece.

39. The reactor of claim 38 further comprising plural RF impedance match networks each connected to respective ones of said plural conductive elements.

40. The reactor of claim 39, further comprising plural RF power level adjusting circuits each connected to said plural RF impedance match networks and to said RF power distribution controller, each of said plural RF power level adjusting circuits capable of changing and setting said RF power level.

41. The reactor of claim 40 wherein each of said plural RF power level adjusting circuits comprises plural variable reactance elements connected in series with respective ones of said plural conductive elements.

42. The reactor of claim 38 further comprising RF power circuitry connected to said plural conductive elements that generates an RF power signal from a common RF power generator.

43. The reactor of claim 38 further comprising plural RF power generators each generating an RF power signal.

44. The reactor of claim 43, wherein at least two of said plural RF power signals are at different frequencies.

45. The reactor of claim 38 wherein said plural conductive elements comprise respective conductors wound around respective axes that are coincident with an axis of symmetry of said workpiece support.

46. The reactor of claim 45, wherein said axis of symmetry is coincident with an axis of symmetry of said dome-shaped ceiling.

47. The reactor of claim 46, wherein each of said plural conductive elements are centered at intervals along plural radii of said dome-shaped ceiling, said plural radii being centered relative to said workpiece support.

48. The reactor of claim 38, wherein said plural conductive elements comprise respective conductors wound around respective axes, said respective axes being distributed among different points over said dome-shaped ceiling, and wherein each of said plural conductive elements have a diameter less than a diameter of said workpiece.

49. The reactor of claim 48, wherein said plural conductive element diameters are a relatively small fraction of said workpiece diameter whereby each one of said plural conductive elements primarily affects a plasma ion density at a small local region over said workpiece.

50. The reactor of claim 49, wherein said intervals are uniform.

51. A method of processing a workpiece, comprising:

coupling RF power into a processing chamber, said processing chamber having a workpiece support therein and a dome-shaped ceiling overlying said workpiece support, using an RF radiator comprising plural conductive elements that are electrically separate from each other and distributed at different locations adjacent said processing chamber, each of said plural conductive elements connected to an RF power distribution controller; and simultaneously controlling an RF power level to each one of said plural conductive elements using said RF power distribution controller so as to control the plasma ion density distribution across the top surface of the workpiece.

52. The method of claim 51, further comprising plural RF impedance match networks each connected to respective ones of said plural conductive elements.

53. The method of claim 52, further comprising plural RF power level adjusting circuits each connected to said plural RF impedance match networks and to said RF power distribution controller, each of said plural RF power level adjusting circuits capable of changing and setting said RF power level.

54. The method of claim 53, wherein each of said plural RF power level adjusting circuits comprise plural variable reactance elements connected in series with respective ones of said plural conductive elements.

55. The method of claim 51 further comprising RF power circuitry connected to said plural conductive elements that generate an RF power signal from a common RF power generator.

56. The method of claim 51 further comprising plural RF power generators each generating an RF power signal.

57. The method of claim 56, wherein at least two of said plural RF power signals are at different frequencies.

58. The method of claim 51, wherein said plural conductive elements comprise respective conductors wound around respective axes that are coincident with an axis of symmetry of said workpiece support.

59. The method of claim 58, wherein said axis of symmetry is coincident with an axis of symmetry of said dome-shaped ceiling.

60. The method of claim 59, wherein each of said plural conductive elements are centered at intervals along plural radii of said dome-shaped ceiling, said plural radii being centered relative to said workpiece support.

61. The method of claim 51, wherein said plural conductive elements comprise respective conductors wound around respective axes, said respective axes being distributed among different points over said dome-shaped ceiling, and wherein each of said plural conductive elements have a diameter less that a diameter of said workpiece.

62. The method of claim 61, wherein said plural conductive elements diameters are a relatively small fraction of said workpiece diameter whereby each one of said plural conductive elements primarily affects a plasma density at a small local region over said workpiece.

63. The method of claim 62, wherein said intervals are uniform.

* * * * *